US009369644B2

(12) United States Patent
Higuchi et al.

(10) Patent No.: US 9,369,644 B2
(45) Date of Patent: Jun. 14, 2016

(54) A/D CONVERTER, SOLID-STATE IMAGE PICKUP DEVICE AND DRIVING METHOD OF THE SAME, AND ELECTRONIC APPARATUS

(75) Inventors: Kenichi Higuchi, Tokyo (JP); Yoshiaki Inada, Tokyo (JP)

(73) Assignee: SONY CORPORATION, Tokyo (JP)

(*) Notice: Subject to any disclaimer, the term of this patent is extended or adjusted under 35 U.S.C. 154(b) by 289 days.

(21) Appl. No.: 14/002,020

(22) PCT Filed: Mar. 23, 2012

(86) PCT No.: PCT/JP2012/057527
§ 371 (c)(1),
(2), (4) Date: Aug. 28, 2013

(87) PCT Pub. No.: WO2012/133192
PCT Pub. Date: Oct. 4, 2012

(65) Prior Publication Data
US 2013/0335609 A1    Dec. 19, 2013

(30) Foreign Application Priority Data
Mar. 30, 2011   (JP) ................... 2011-075959

(51) Int. Cl.
*H04N 3/14*   (2006.01)
*H04N 5/347*   (2011.01)
(Continued)

(52) U.S. Cl.
CPC ............... *H04N 5/347* (2013.01); *H03M 1/145* (2013.01); *H04N 5/378* (2013.01); *H03M 1/123* (2013.01); *H03M 1/56* (2013.01)

(58) Field of Classification Search
CPC ........ H04N 5/378; H03M 1/12; H03M 1/123; H03M 1/145; H03M 1/56
USPC .......... 349/294, 308–310; 348/294, 308–310; 250/208.1
See application file for complete search history.

(56) References Cited

U.S. PATENT DOCUMENTS 6,956,516 B2 *   10/2005   Furuichi ............... G01K 1/028
                                                    341/118
7,952,630 B2 *    5/2011   Taura .................... H04N 5/378
                                                    348/294

(Continued)

FOREIGN PATENT DOCUMENTS

CN          101924558 A      12/2010
JP          2002-232291       8/2002
(Continued)

OTHER PUBLICATIONS

International Search Report; International Application No. PCT/JP2012/057527; International Filing Date: Mar. 23, 2012; Completion of the International Search Report: Apr. 6, 2012. (PCT/ISA/210).
(Continued)

Primary Examiner — Ngoc-Yen Vu
(74) Attorney, Agent, or Firm — Michael Best & Friedrich LLP

(57) ABSTRACT

The present technology relates to an A/D converter, a solid-state image pickup device and a method of driving the same, and an electronic apparatus which are capable of reducing power consumption while reducing a circuit size. A comparator compares a reference voltage with an input voltage, the reference voltage having a ramp waveform whose voltage value varies with time, a lower-bit storage element holds a count value in a predetermined count pattern, based on an output signal from the comparator, a Gray code binary conversion circuit converts the count value in the count pattern held by the lower-bit storage element into binary data, and a storing operation control circuit supplies a pulse signal corresponding to the binary data obtained by conversion in the Gray code binary conversion circuit to a lower-bit U/D CNT. The present technology is applicable to, for example, an image sensor storing a count value in a storage element with use of a Gray code or a phase shift code as a clock signal.

19 Claims, 11 Drawing Sheets

(51) Int. Cl.
  *H03M 1/14* (2006.01)
  *H04N 5/378* (2011.01)
  *H04N 5/335* (2011.01)
  *H03M 1/12* (2006.01)
  *H03M 1/56* (2006.01)

(56) References Cited

U.S. PATENT DOCUMENTS

| | | | | |
|---|---|---|---|---|
| 8,039,781 | B2* | 10/2011 | Shimomura | H04N 5/3742 250/208.1 |
| 8,054,354 | B2* | 11/2011 | Taura | H04N 5/335 348/187 |
| 8,421,891 | B2* | 4/2013 | Morikawa | H03M 1/0624 341/155 |
| 9,019,142 | B2* | 4/2015 | Hiraoka | H04N 5/374 341/155 |
| 2010/0110252 | A1 | 5/2010 | Shimomura et al. | |
| 2010/0271519 | A1 | 10/2010 | Ui et al. | |

FOREIGN PATENT DOCUMENTS

| | | |
|---|---|---|
| JP | 2005-027232 | 1/2005 |
| JP | 2006-128752 | 5/2006 |
| JP | 2009-038726 A | 2/2009 |

OTHER PUBLICATIONS

Written Opinion of the International Searching Authority; International Application No. PCT/JP2012/057527; International Filing Date: Mar. 23, 2012; Dated: Apr. 17, 2012. (Form PCT/ISA/220 and PCT/ISA/237).

Extended European Search Report issued Jan. 23, 2015 for corresponding European Application No. 12 76 4434.2.

Chinese Office Action issued Mar. 11, 2016 for corresponding Chinese Application No. 201280014570.5.

* cited by examiner

A/D CONVERTER, SOLID-STATE IMAGE PICKUP DEVICE AND DRIVING METHOD OF THE SAME, AND ELECTRONIC APPARATUS

TECHNICAL FIELD

The present technology relates to an A/D converter, a solid-state image pickup device and a method of driving the same, and an electronic apparatus, and more specifically relates to an A/D converter, a solid-state image pickup device and a method of driving the same, and an electronic apparatus which are capable of reducing power consumption while reducing a circuit size.

BACKGROUND ART

In related art, an image sensor performs CDS (Correlated Double Sampling) processing in which A/D (Analog-to-Digital) conversion is performed on reset components and signal components in each vertical column of pixels, and each of differences between the rest components and the signal components is determined to reduce noise.

In the CDS processing, for example, a count value of the reset component is down-counted and held, and after that, a count value of the signal component is up-counted from the held count value to determine a difference between the reset component and the signal component.

On the other hand, an image sensor storing a count value in a storage element with use of a Gray code or a phase shift code as a clock signal has been proposed (for example, refer to PTL 1).

CITATION LIST

Patent Literature

[PTL 1] Japanese Unexamined Patent Application Publication No. 2009-38726

SUMMARY

Technical Problem

However, in a case where it is considered to perform the above-described CDS processing in the image sensor in PTL 1, a count value of a reset component stored in the storage element is eliminated upon reading a signal component, and a difference between the reset component and the signal component is not allowed to be determined.

Therefore, it is necessary to include a storage element holding the count value of the reset component and a storage element holding the count value of the signal component, and in this case, two groups of N-number of storage elements (that is, 2N-number of storage elements) for an N-bit signal are necessary, and 2N-number of signal lines transmitting the count values of the reset components and the signal components to a subtracter determining each of differences between the reset components and the signal components are necessary. Accordingly, a circuit size is increased, and power consumption for transmission and transmission time are increased.

Moreover, in the image sensor in PTL 1, because of a characteristic in which the storage element holds the count value, addition and subtraction are not allowed to be performed in the image sensor; therefore, to achieve a configuration in which two or more signals are added in an A/D converter, it is necessary to further include a circuit for addition.

The present technology has been made in view of such circumstances to allow a reduction in power consumption while reducing a circuit size.

Solution to Problem

An A/D converter according to an aspect of the present technology includes: a comparison section comparing a reference voltage with an input voltage, the reference voltage having a ramp waveform whose voltage value varies with time; a storage section holding a count value in a predetermined count pattern, based on an output signal from the comparison section; a conversion section converting the count value in the count pattern held by the storage section into binary data; and a supply section supplying a pulse signal corresponding to the binary data obtained by conversion in the conversion section to a first counter.

The storage section may supply, to a second counter, a most significant bit signal representing a most significant bit of the count value in the count pattern until the output signal from the comparison section is reversed, and may hold lower bits lower than the most significant bit of the count value in the count pattern when the output signal from the comparison section is reversed.

The conversion section may convert lower bits of the count value in the count pattern into binary data, and the supply section may supply, to the first counter, a pulse signal corresponding to a value of each bit in the binary data of a reference signal serving as a reference pulse signal.

The reference signal may be a pulse signal configured of n-number of pulse trains of $2^0$ to $2^n$ pulses, where the bit number of the lower bits is n, and the supply section may supply, to the first counter, a pulse train corresponding to each bit whose value is 1 of 0th to nth bits in the binary data of the reference signal.

The second counter may count a most significant bit of a count value in the first counter as a carry.

The A/D converter may further include a bit mismatch prevention section preventing a bit mismatch of the most significant bit signal supplied to the second counter.

The count pattern may be a Gray code.
The count pattern may be a phase shift code.

A solid-state image pickup device according to an aspect of the present technology includes: a pixel array in which a plurality of pixels performing photoelectric conversion are arranged in a matrix; and an A/D converter provided to every column or every plurality of columns of the pixels and converting analog signals output from the pixels of each column into digital signals, in which the A/D converter includes a comparison section comparing a reference voltage with an input voltage of the analog signal, the reference voltage having a ramp waveform whose voltage value varies with time, a storage section holding a count value in a predetermined count pattern, based on an output signal from the comparison section, a conversion section converting the count value in the count pattern held by the storage section into binary data, and a supply section supplying a pulse signal corresponding to the binary data obtained by conversion in the conversion section to a first counter.

The storage section may supply, to a second counter, a most significant bit signal representing a most significant bit of the count value in the count pattern until the output signal from the comparison section is reversed, and holds lower bits lower than the most significant bit of the count value in the count pattern when the output signal from the comparison section is reversed.

The conversion section may convert lower bits of the count value in the count pattern into the binary data, and the supply section may supply, to the first counter, a pulse signal corresponding to a value of each bit in the binary data of a reference signal serving as a reference pulse signal.

The reference signal may be a pulse signal configured of n-number of pulse trains of $2^0$ to $2^n$ pulses, where the bit number of the lower bits is n, and the supply section may supply, to the first counter, a pulse train corresponding to each bit whose value is 1 of 0th to nth bits in the binary data of the reference signal.

The second counter may count a most significant bit of a count value in the first counter as a carry.

The solid-state image pickup device may further include a clock generation section generating a clock signal; and an input section inputting a count value in the count pattern to the storage section, based on the clock signal.

In the solid-state image pickup device, the input section may be provided to every plurality of the A/D converters, a clock buffer for transmitting the clock signal to the input section provided to every plurality of the A/D converters may be provided to every plurality of the A/D converters, and the clock buffer may transmit the reference signal to the supply section after the output signal from the comparison section is reversed.

The A/D converter may further include a bit mismatch prevention section preventing a bit mismatch of the most significant bit signal supplied to the second counter.

The count pattern may be a Gray code.

The count pattern may be a phase shift code.

There is provided a method of driving a solid-state imaging device according to an aspect of the present technology, the solid-state imaging device including a pixel array in which a plurality of pixels performing photoelectric conversion are arranged in a matrix, and an A/D converter provided to every column or every plurality of columns of the pixels and converting analog signals output from the pixels of each column into digital signals, the method including: a comparing step of allowing the A/D converter to compare a reference voltage with an input voltage of the analog signal, the reference voltage having a ramp waveform whose voltage value varies with time; a storing step of allowing the A/D converter to hold a count value in a predetermined count pattern, based on an output signal from the comparison section; a converting step of allowing the A/D converter to convert the count value in the count pattern held by the storage section into binary data; and a supplying step of allowing the A/D converter to supply a pulse signal corresponding to the binary data obtained by conversion in the conversion section to a counter.

There is provided an electronic apparatus according to an aspect of the present technology provided with a solid-state image pickup device, the solid-state image pickup device including: a pixel array in which a plurality of pixels performing photoelectric conversion are arranged in a matrix; and an A/D converter provided to every column or every plurality of columns of the pixels and converting analog signals output from the pixels of each column into digital signals, in which the A/D converter includes a comparison section comparing a reference voltage with an input voltage of the analog signal, the reference voltage having a ramp waveform whose voltage value varies with time; a storage section holding a count value in a predetermined count pattern, based on an output signal from the comparison section; a conversion section converting the count value in the count pattern held by the storage section into binary data; and a supply section supplying a pulse signal corresponding to the binary data obtained by conversion in the conversion section to a counter.

In the aspects of the present technology, a reference voltage having a ramp waveform whose voltage value varies with time is compared with an input voltage of an analog signal, a count value in a predetermined count pattern is held, based on an output signal as a comparison result, the held count value in the count pattern is converted into binary data, a pulse signal corresponding to the binary data obtained by conversion is supplied to a counter.

Advantageous Effects of Invention

According to the aspects of the present technology, power consumption is allowed to be reduced while reducing a circuit size.

DESCRIPTION OF EMBODIMENTS

Some embodiments of the present technology will be described in detail below referring to the accompanying drawings. It is to be noted that description will be given in the following order.

1. Basic Application Example of Present Technology
2. Application Example with a Large Number of Columns
3. Application Example Taking Measures against Metastable
4. Others <1. Basic Application Example of Present Technology>
[Configuration Example of Solid-State Image Pickup Device]

Figure 1:
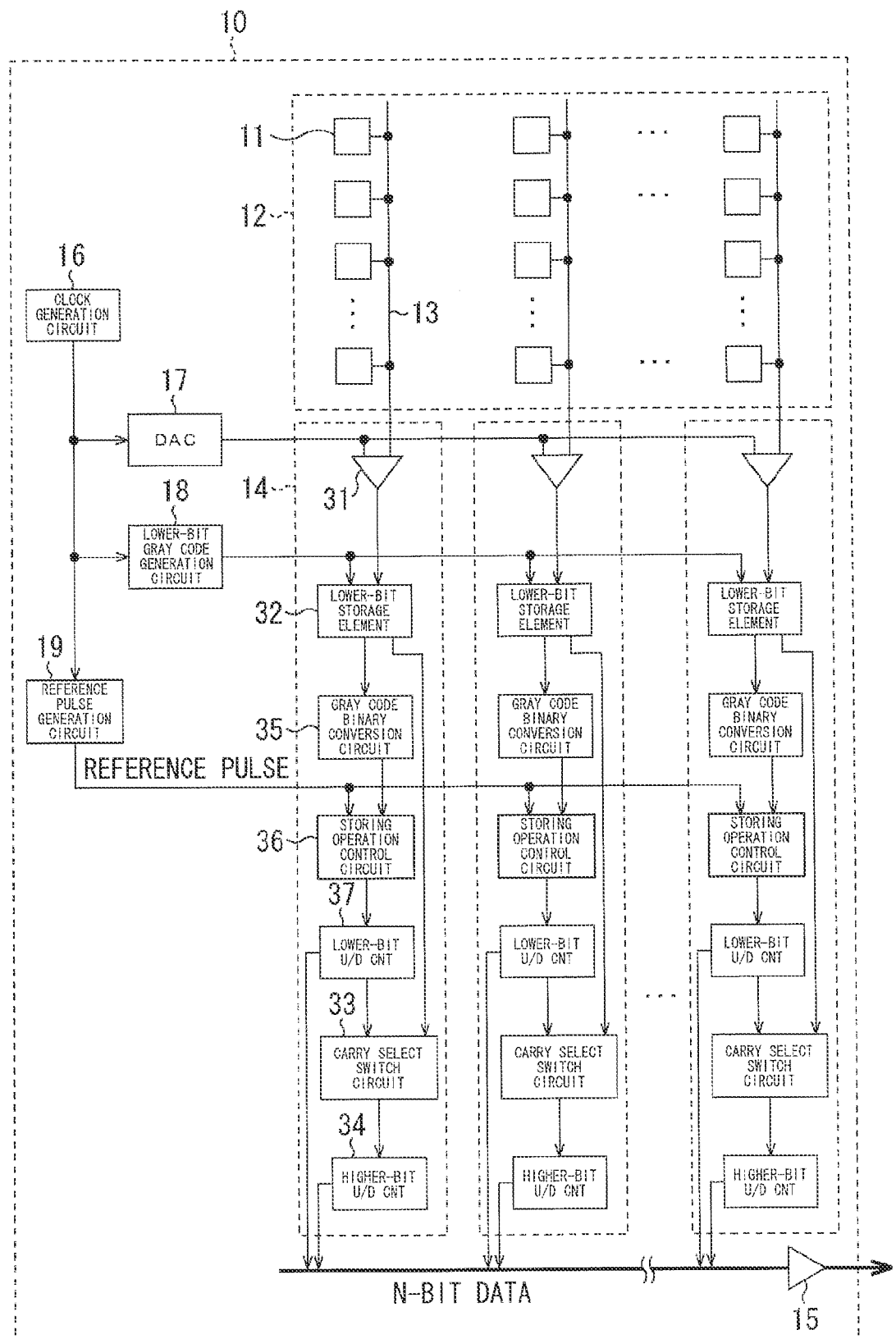
FIG. 1 is a diagram illustrating a configuration example of an embodiment of a solid-state image pickup device to which the present technology is applied.

FIG. 1 illustrates a configuration example of a CMOS (Complementary Metal Oxide Semiconductor) image sensor (hereinafter simply referred to as "image sensor") as a solid-state image pickup device to which the present technology is applied.

An image sensor 10 in FIG. 1 includes a pixel array section 12 including pixels which are arranged in a matrix, and reads signals (analog signals) of pixels through vertical signal lines 13 formed for respective columns along a vertical direction (a pixel arrangement direction in a pixel column) in the drawing.

A column AD conversion circuit 14 converts an analog signal read through the vertical signal line 13 into an N-bit digital signal, and then to output the N-bit digital signal to an output buffer 15. Predetermined digital signal processing is performed on the digital signal output from the output buffer 15 in a digital signal processing circuit (not illustrated) subsequent to the output buffer 15.

A clock generation circuit 16 generates a clock signal to supply the clock signal to a DAC (Digital Analog Converter) 17, a lower-bit Gray code generation circuit 18, and a reference pulse generation circuit 19.

The DAC 17 generates, based on the clock signal from the clock generation circuit 16, a reference voltage having a ramp waveform whose voltage value varies with time, and inputs the reference voltage to the column AD conversion circuit 14.

The lower-bit Gray code generation circuit 18 is a so-called Gray code counter, and performs counting in Gray code, based on the clock signal from the clock generation circuit 16.

The reference pulse generation circuit 19 generates a reference pulse signal which will be described later, based on the clock signal from the clock generation circuit 16, and supplies the reference pulse signal to the column AD conversion circuit 14.

Next, a configuration of the column AD conversion circuit 14 will be described below.

The column AD conversion circuit 14 includes a comparator 31, a lower-bit storage element 32, a carry select switch circuit 33, a higher-bit U/D CNT (Up/Down Counter) 34, a Gray code binary conversion circuit 35, a storing operation control circuit 36, and a lower-bit U/D CNT 37.

The comparator 31 compares the reference voltage input from the DAC 17 with a voltage (an input voltage) of the analog signal read through the vertical signal line 13, and supplies, to the lower-bit storage element 32, an output based on a magnitude relationship between the reference voltage and the input voltage. When the magnitude relationship between the reference voltage and the input voltage is reversed, the comparator 31 reverses the output.

The lower-bit storage element 32 supplies, to the higher-bit U/D CNT 34, a most significant bit signal representing a most significant bit of a count value in Gray code of the lower-bit Gray code generation circuit 18 through the carry select switch circuit 33 until the output of the comparator 31 is reversed. Moreover, when the output of the comparator 31 is reversed, the lower-bit storage element 32 holds lower bits lower than the most significant bit of the count value by counting in Gray code, and supplies the count values of the lower bits to the Gray code binary conversion circuit 35.

The carry select switch circuit 33 is configured of a switch selecting a most significant bit signal from the lower-bit storage element 32 or a most significant bit signal from the higher-bit U/D CNT 37 to supply the selected signal to the higher-bit U/D CNT 34.

The higher-bit U/D CNT 34 performs counting in response to the most significant bit signal from the carry select switch circuit 33, and holds a count value obtained thereby. Most significant bits of a Gray code and a binary code are identical; therefore, the higher-bit U/D CNT 34 counts the most significant bit in binary code.

The Gray code binary conversion circuit 35 converts the count values of the lower bits in Gray code from the lower-bit storage element 32 into binary data, and supplies the binary data to the storing operation control circuit 36.

The storing operation control circuit 36 supplies (stores) a pulse signal corresponding to the binary data from the Gray code binary conversion circuit 35 to (in) the lower-bit U/D CNT 37. More specifically, for example, the storing operation control circuit 36 supplies, to the lower-bit U/D CNT 37, a pulse signal, corresponding to a value of each bit in the binary data from the Gray code binary conversion circuit 35, of the reference pulse signal from the reference pulse generation circuit 19. The number of pulses in the pulse signal to be supplied to the lower-bit U/D CNT 37 is set to be the same as a value of the binary data into which the count values in Gray code are converted.

The lower-bit U/D CNT 37 performs counting in response to the pulse signal from the storing operation control circuit 36, and holds a count value obtained thereby. In other words, the lower-bit U/D CNT 37 counts the lower bits in binary code.

[Specific Configuration Example of Column AD Conversion Circuit]

Now, a specific configuration example of the column AD conversion circuit 14 in FIG. 1 will be described referring to FIG. 2. It is to be noted that the comparator 31 is not illustrated in the column AD conversion circuit 14 in FIG. 2.

Figure 2:
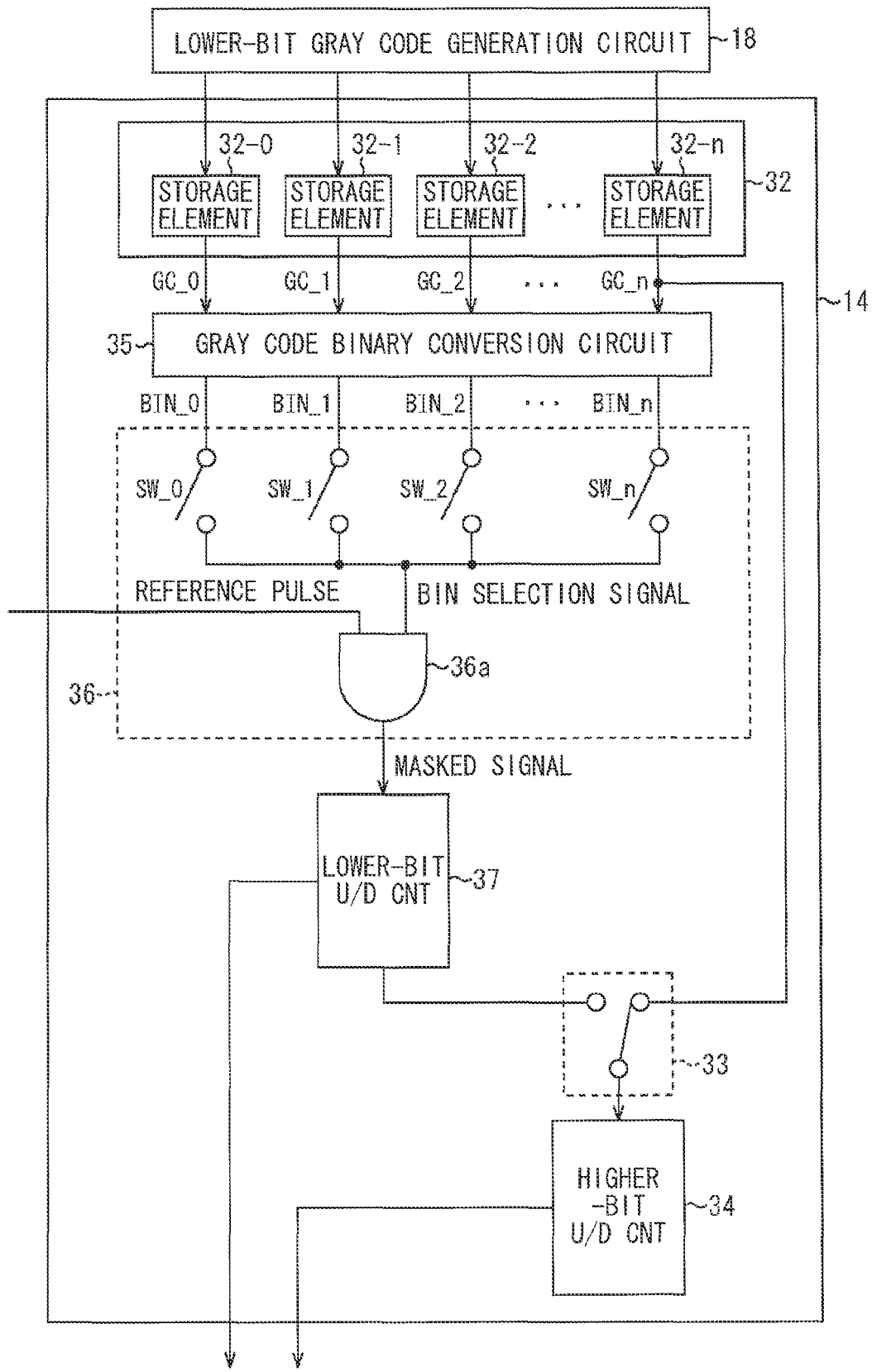
FIG. 2 is a diagram illustrating a specific configuration example of a column AD conversion circuit.

In the column AD conversion circuit 14 in FIG. 2, the lower-bit storage element 32 is configured of n-number of storage elements 32-0 to 32-$n$. Respective count values by counting in Gray code from the lower-bit Gray code generation circuit 18 are input to the respective storage elements 32-0 to 32-$n$.

Until the output of the comparator 31 is reversed, in a case where a carry occurs in the count value to be input to the storage element 32-$n$ of the count values to be input to the storage elements 32-0 to 32-$n$, the above-described most significant bit signal is supplied to the higher-bit U/D CNT 34 through the carry select switch circuit 33.

When the output of the comparator 31 is reversed, supply of the most significant bit signal from the storage element 32-$n$ to the higher-bit U/D CNT 34 stops, and count values input to the storage elements 32-0 to 32-$n$ at this time are held by the storage elements 32-0 to 32-$n$, respectively. At this time, a switch of the carry select switch circuit 33 is turned from the lower-bit storage element 32 side to the lower-bit U/D CNT 37 side.

After that, count values GC_0 to GC_n in Gray code held by the storage elements 32-0 to 32-$n$, respectively, are supplied to the Gray code binary conversion circuit 35.

The Gray code binary conversion circuit 35 converts the count values GC_0 to GC_n in Gray code from the storage elements 32-0 to 32-$n$ into binary data BIN_0 to BIN_n, respectively, and supplies the binary data BIN_0 to BIN_n to the storing operation control circuit 36.

The storing operation control circuit 36 in FIG. 2 is configured of BIN selection switches SW_0 to SW_n and an AND gate 36$a$.

The BIN selection switches SW_0 to SW_n perform an ON/OFF operation in order from the BIN selection switch SW_0, and inputs, to the AND gate 36$a$, BIN selection signals as output signals corresponding to values of the binary data BIN_0 to BIN_n input (supplied) to the BIN selection switches SW_0 to SW_n, respectively.

The AND gate 36$a$ outputs pulse trains configuring the reference pulse signal from the reference pulse generation circuit 19 with timing of reception of the BIN selection signals from the BIN selection switches SW_0 to SW_n.

[Reference Pulses and Operations of BIN Selection Switches]

Now, the reference pulses and operations of the BIN selection switches will be described referring to FIG. 3.

The reference pulse signal generated by the reference pulse generation circuit 19 is a pulse signal configured of n-number of pulse trains of $2^0$ to $2^n$ pulses, where the bit number of lower bits is n. More specifically, as illustrated in the first line from the top in FIG. 3, the reference pulse signal is a pulse signal configured of n-number of pulse trains of 1, 2, 4, 8, ..., $2^n$ pulses.

Figure 3:
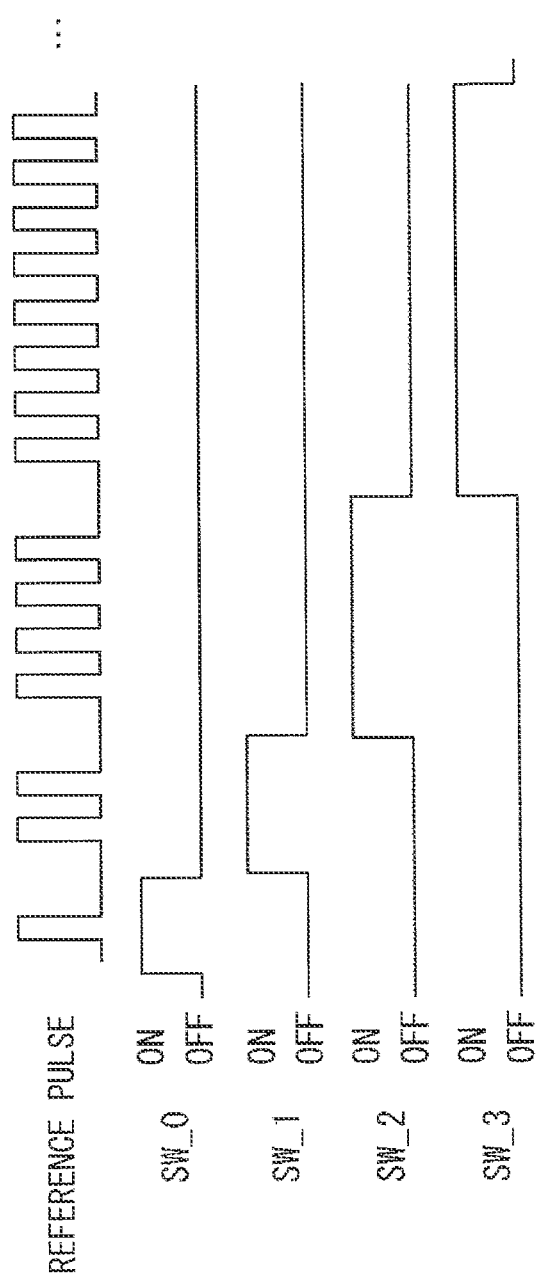
FIG. 3 is a diagram describing reference pulses and operations of BIN selection switches.

Moreover, as illustrated in the second and subsequent lines from the top in FIG. 3, the BIN selection switches SW_0 to SW_n perform the ON/OFF operation in order from the BIN selection switch SW_0. In FIG. 3, the operations of the BIN selection switches SW_0 to SW_3 are illustrated, and BIN selection signals corresponding to values of the binary data BIN_0 to BIN_3 to be input to the BIN selection switches SW_0 to SW_3, respectively, are input to the AND gate 36a.

It is to be noted that, as illustrated in FIG. 3, a first pulse train (of $2^0$ (=1) pulses) in the reference pulse signal corresponds to the operation of the BIN selection switch SW_0 (BIN selection signal), and a second pulse train (of $2^1$ (=2) pulses) in the reference pulse signal corresponds to the operation of the BIN selection switch SW_1 (BIN selection signal). Likewise, a third pulse train (of $2^2$ (=4) pulses) in the reference pulse signal corresponds to the operation of the BIN selection switch SW 2 (BIN selection signal), and a fourth pulse train (of $2^3$ (=8) pulses) in the reference pulse signal corresponds to the operation of the BIN selection switch SW_3 (BIN selection signal). Thus, an (i+1)th pulse train (of $2^i$ pulses) in the reference pulse signal corresponds to an operation of a BIN selection switch SW_i (BIN selection signal).

In other words, in the AND gate 36a, n-number of pulse trains in the reference pulse signal pass through or are masked, based on ON or OFF (1 or 0) of the BIN selection signals corresponding to the values of the binary data BIN_0 to BIN_n. More specifically, in a case where a value of an ith bit (BIN_i) of the binary data BIN_0 to BIN_n is 1, an (i+1)th pulse train (of $2^i$ pulses) in the reference pulses passes through, and in a case where the value of the ith bit (BIN_i) is 0, the (i+1)th pulse train (of $2^i$ pulses) in the reference pulses is masked. The reference pulses configured of pulse trains passing through or masked by the AND gate 36a are supplied to the lower-bit U/D CNT 37 as a masked signal.

[Example of a Mask of Reference Pulse by BIN Selection Signal]

Now, an example of masking of the reference pulses by a BIN selection signal will be described referring to FIG. 4.

For example, it is assumed that lower 4 bits of the binary data obtained by conversion by the Gray code binary conversion circuit 35 is "1010" (which is equivalent to "10" in decimal).

Figure 4:
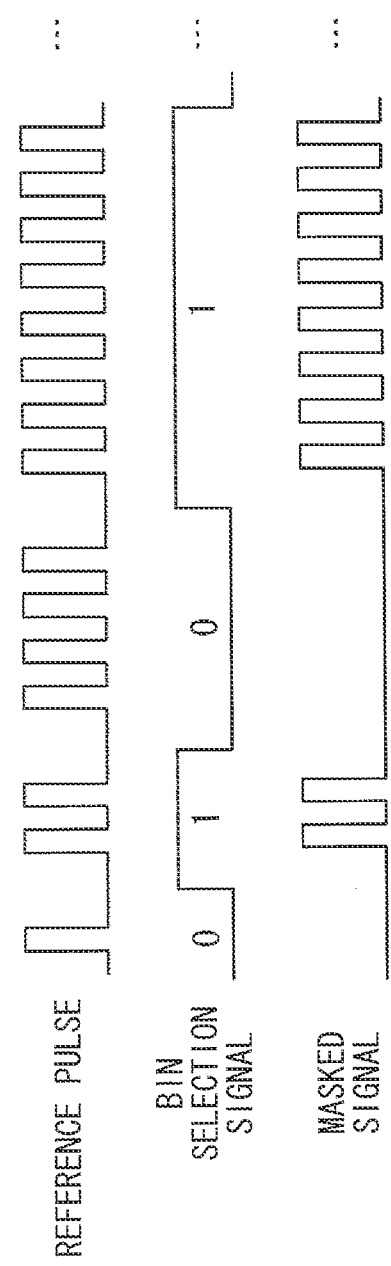
FIG. 4 is a diagram describing an example of masking of the reference pulses by a BIN selection signal.

In this case, values of the first bit and the third bit in the binary data are 1 (values of the 0th bit and the second bit are 0); therefore, a BIN selection signal which is illustrated in the second line from the top in FIG. 4 and corresponds to values "0", "1", "0", and "1" of the binary data BIN_0 to BIN_3 to be input to the BIN selection switches SW_0 to SW_3, respectively, is input to the AND gate 36a. Meanwhile, the reference pulses in the first line from the top in FIG. 4 are input to the AND gate 36a.

Thus, by the AND gate 36a, the first pulse train (of $2^0$ (=1) pulses) in the reference pulses is masked, the second pulse train (of $2^1$ (=2) pulses) passes through, the third pulse train (of $2^2$ (=4) pulses) is masked, and the fourth pulse train (of $2^3$ (=8) pulses) is masked. As a result, as illustrated in the third line from the top in FIG. 4, as a masked signal, a masked signal of 10 pulses is supplied to the lower-bit U/D CNT 37. In other words, the same number of pulses as the value of binary data obtained by conversion by the Gray code binary conversion circuit 35 are supplied.

Then, the lower-bit U/D CNT 37 counts the pulses supplied as the masked signal, that is, counts the value of the binary data obtained by conversion by the Gray code binary conversion circuit 35, and holds a count value obtained thereby. Thus, the lower-bit U/D CNT 37 counts lower bits held by the lower-bit storage element 32 in binary code.

It is to be noted that, in a case where a carry from an nth bit occurs in the count value in the lower-bit U/D CNT 37, a most significant bit signal is supplied to the higher-bit U/D CNT 34 through the carry select switch circuit 33. In other words, the higher-bit U/D CNT 34 counts the most significant bit in the lower-bit U/D CNT 37 as a carry.

[About Operation of Column AD Conversion Circuit]

Next, an operation of the column AD conversion circuit 14 will be described below referring to a timing chart in FIG. 5.

Figure 5:
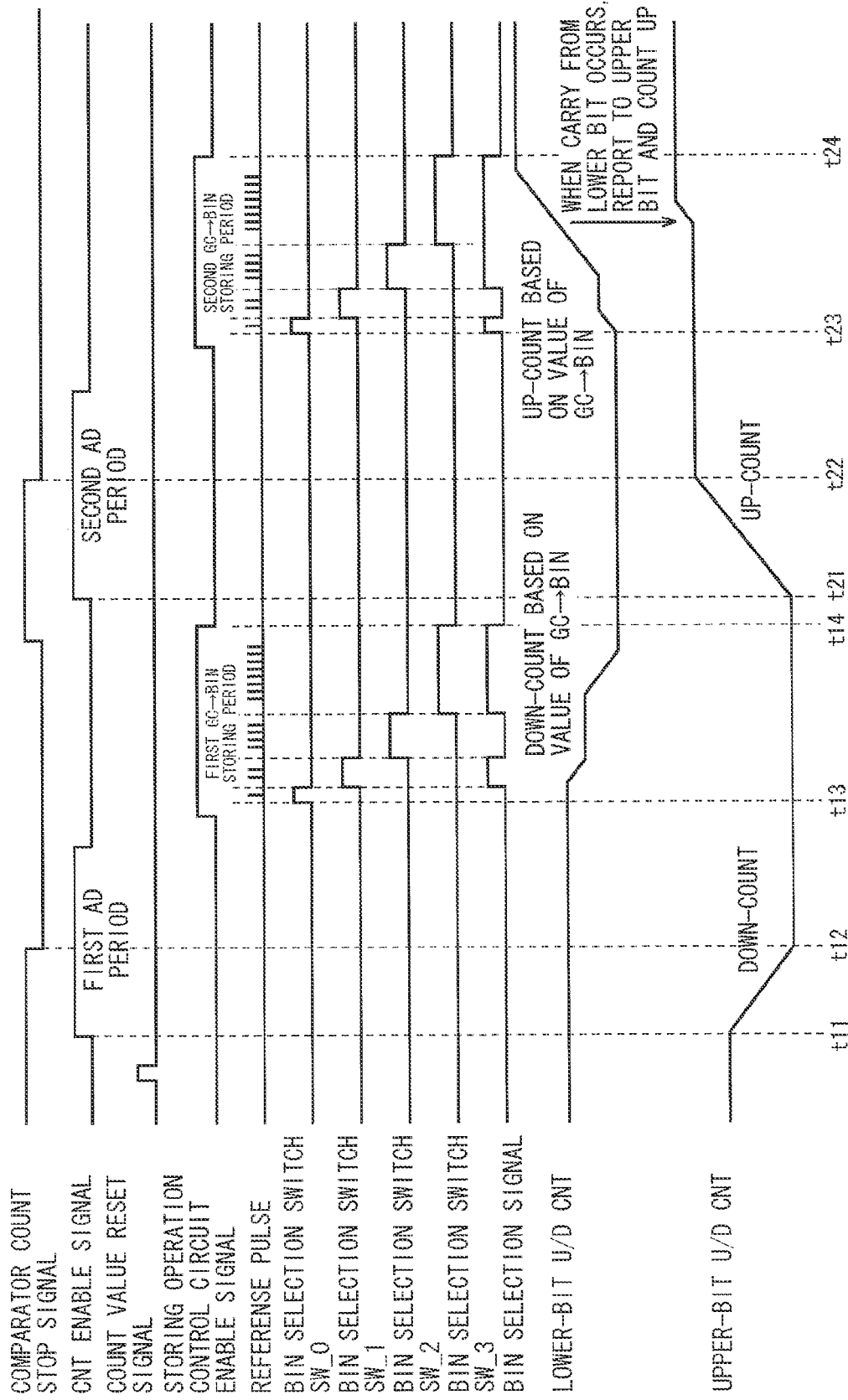
FIG. 5 is a timing chart describing an operation of the column AD conversion circuit.

It is to be noted that, in an example in FIG. 5, the lower-bit storage element 32 holds count values of 0th to 3rd bits (n=3).

First, after a count value reset signal for resetting count values of the higher-bit U/D CNT 34 and the lower-bit U/D CNT 37 is input, when a CNT (counter) enable signal is turned on at a time t11, reading of a reset level (a reset component) of each vertical column of the pixels 11 starts. In the example in FIG. 5, a reset level reading period is referred to as "first AD period". At this time, the higher-bit U/D CNT 34 starts down-counting of most significant bits of count values in Gray code input to the storage elements 32-0 to 32-3.

At a time t12, when the output (a count stop signal) of the comparator 31 is reversed, the higher-bit U/D CNT 34 stops down-counting, and holds count values at this time, and the storage elements 32-0 to 32-3 also hold count values at this time.

After the first AD period, when an storing operation control circuit enable signal is turned on, an operation of storing count values of lower bits held by the storage elements 32-0 to 32-3 by the storing operation control circuit 36 (a first GC BIN storing period) starts. At this time, the Gray code binary conversion circuit 35 converts count values GC_0 to GC_3 in Gray code from the storage elements 32-0 to 32-3 into binary data BIN_0 to BIN_3, and supplies the binary data BIN_0 to BIN_3 to the storing operation control circuit 36.

Then, at a time t13, in the storing operation control circuit 36, a BIN selection signal corresponding to values (in the example in FIG. 5, "0", "1", "0", and "1") of the binary data BIN_0 to BIN_3 to be input to the BIN selection switches SW_0 to SW_3, respectively, together with the reference pulses from the reference pulse generation circuit 19, starts to be input to the AND gate 36a. Then, as described referring to FIG. 4, when the reference pulses having passed through or having been masked by the AND gate 36a are supplied to the lower-bit U/D CNT 37 as a masked signal, the lower-bit U/D CNT 37 starts down-counting of pulses supplied as the masked signal. Down-counting by the lower-bit U/D CNT 37 is performed until a time t14.

At the time t14, when the storing operation control circuit enable signal is turned off, and the first GC BIN storing period ends, the lower-bit U/D CNT 37 stops down-counting, and holds count values at this time.

Thus, the count value of the reset level is down-counted and held by the higher-bit U/D CNT 34 and the lower-bit U/D CNT 37.

Next, at a time t21, when a CNT enable signal is turned on, reading of a signal level (a signal component) of each vertical column of the pixels 11 starts. In the example in FIG. 5, a signal level reading period is referred to as "second AD period". At this time, the higher-bit U/D CNT 34 starts up-counting of most significant bits of count values in Gray code to be input to the storage elements 32-0 to 32-3 from the count value held at the time t12. It is to be noted that, in the storage elements 32-0 to 32-3, the count value of the reset level is eliminated.

At a time t22, when the output (the count stop signal) of the comparator 31 is reversed, the higher-bit U/D CNT 34 stops up-counting, and holds a count value at this time, and the storage elements 32-0 to 32-3 also hold the count values at this time.

After the second AD period, when the storing operation control circuit enable signal is turned on, an operation of storing count values of lower bits held by the storage elements 32-0 to 32-3 by the storing operation control circuit 36 (a second GC BIN storing period) starts. At this time, the Gray code binary conversion circuit 35 converts the count values GC_0 to GC_3 in Gray code from the storage elements 32-0 to 32-3 into the binary data BIN_0 to BIN_3, respectively, and supplies the binary data BIN_0 to BIN_3 to the storing operation control circuit 36.

Then, at a time t23, in the storing operation control circuit 36, a BIN selection signal corresponding to values (in the example in FIG. 5, "1", "0", "1", and "1") of the binary data BIN_0 to BIN_3 to be input to the BIN selection switches SW_0 to SW_3, respectively, together with the reference pulses from the reference pulse generation circuit 19, starts to be input to the AND gate 36a. Then, as described referring to FIG. 4, when the reference pulses having passed through or having been masked by the AND gate 36a are supplied to the lower-bit U/D CNT 37 as a masked signal, the lower-bit U/D CNT 37 starts up-counting of pulses supplied as the masked signal from the value held at the time t14. Up-counting by the lower-bit U/D CNT 37 is performed until a time t24.

It is to be noted that, in the example in FIG. 5, in a period from the time t23 to the time t24, a carry in the count value in the lower-bit U/D CNT 37 occurs, and the higher-bit U/D CNT 34 up-counts the most significant bit in the lower-bit U/D CNT 37 as a carry.

At the time t24, when the storing operation control circuit enable signal is turned off, and the second GC BIN storing period ends, the lower-bit U/D CNT 37 stops up-counting, and holds a count value at this time.

Thus, the count value of the signal level is up-counted and held by the higher-bit U/D CNT 34 and the lower-bit U/D CNT 37.

In other words, the count value of the reset level is down-counted and held, and the count value of the signal level is up-counted from the held count value; therefore, CDS processing is allowed to be performed on each column.

After that, respective bit values from the higher-bit U/D CNT 34 and the lower-bit U/D CNT 37 are output in order, and data of all bits (N bits) are output.

In the above operation, even if CDS processing is performed in an image sensor storing a count value in a storage element with use of a Gray code, it is not necessary to include a storage element holding a count value of a reset component and a storage element holding a count value of a signal component, and it is not necessary to include signal lines transmitting the count values of the reset component and the signal component to a subtracter determining a difference between the reset component and the signal component; therefore, power consumption is allowed to be reduced while reducing a circuit size.

Moreover, a lower bit storing operation is performed between a rest level reading operation and a signal level reading operation and after the signal level reading operation; therefore, CDS processing is allowed to be performed without increasing processing time.

Further, a data amount (a bit amount) used in the storing operation is reduced to only lower bits; therefore, power consumption by subsequent digital signal processing is allowed to be further reduced while reducing a circuit size for transfer.

It is to be noted that timings of operations of the higher-bit U/D CNT 34 and the lower-bit U/D CNT 37 are different in the reading operation and the lower bit storing operation; therefore, the count values of the higher-bit U/D CNT 34 and the lower-bit U/D CNT 37 each include an offset component, but the offset component is cancelled by CDS processing, and a correct count value is obtainable in the end accordingly.

Moreover, in a configuration in which signals of two or more pixels are added in the A/D converter, after a count value of a certain pixel is obtained by the operation illustrated in FIG. 5, the count value is not reset, and the operation illustrated in FIG. 5 is performed again after switching to a pixel to be selected; therefore, addition is performed in the higher-bit U/D CNT 34 and the lower-bit U/D CNT 37. Thus, in the present technology, the configuration in which the signals of two or more pixels are added in the A/D converter is achievable without further including a circuit for addition.

A configuration in which a count value in Gray code of the lower-bit Gray code generation circuit 18 is supplied to all of the column AD conversion circuits 14 for respective pixel columns is described above; however, in a case where the number of columns is large, a load of pulse transmission from the lower-bit Gray code generation circuit 18 is increased, thereby not allowing high-speed pulses to be transmitted.

Therefore, a configuration in which a lower-bit Gray code generation circuit is provided to every plurality of column AD conversion circuits 14 will be described below.

<2. Application Example with a Large Number of Columns>
[Configuration Example of Solid-State Image Pickup Device]

Figure 6:
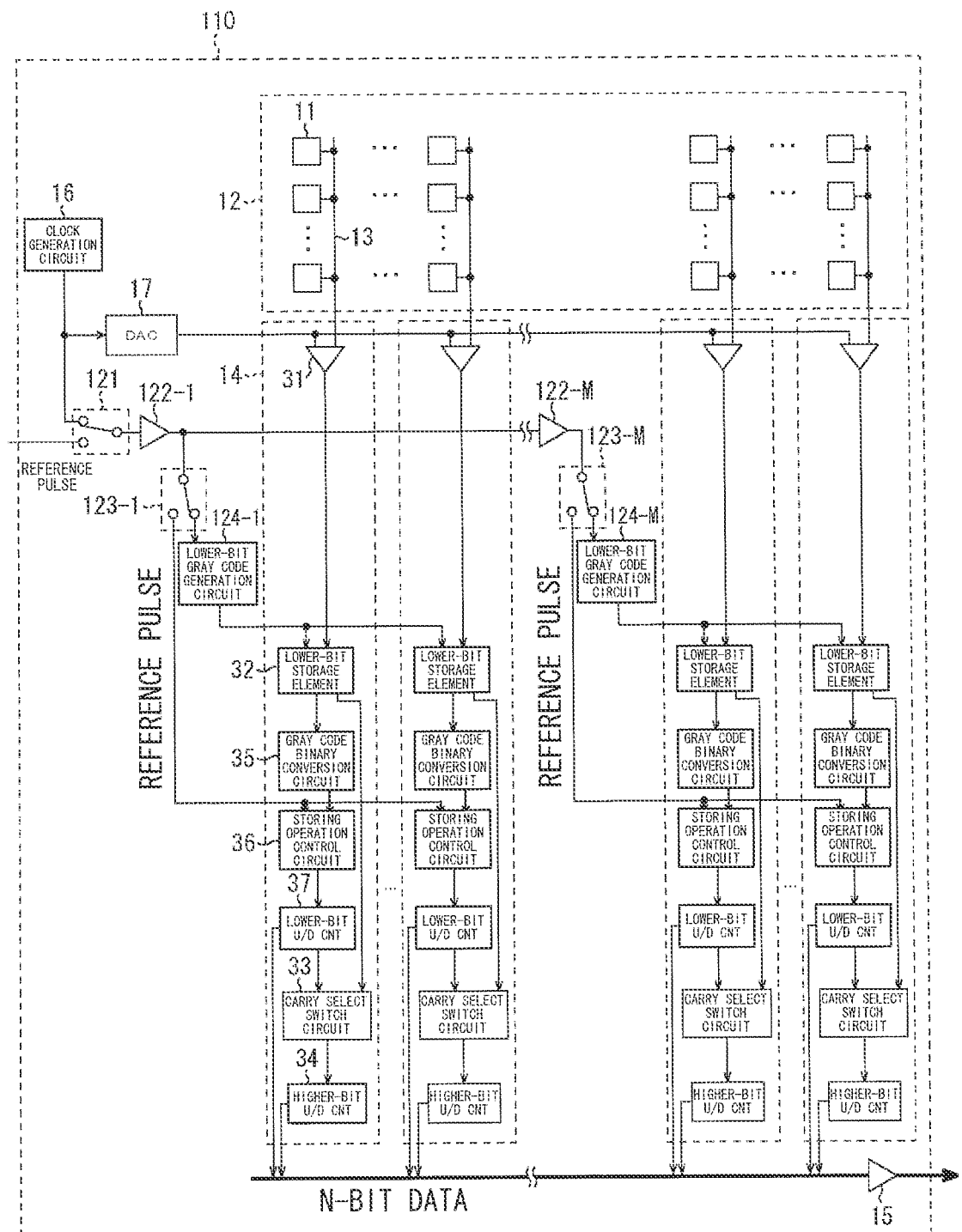
FIG. 6 is a block diagram illustrating another functional configuration example of the solid-state image pickup device.

FIG. 6 illustrates a configuration example of an image sensor (a CMOS image sensor) as a solid-state image pickup device in which a lower-bit Gray code generation circuit is provided to every plurality of column AD conversion circuits 14.

It is to be noted that, in an image sensor 110 in FIG. 6, like components are denoted by like numerals as of the image sensor 10 in FIG. 1 and will not be further described.

In other words, the image sensor 110 in FIG. 6 is different from the image sensor 10 in FIG. 1 in that a clock selector switch 121, clock buffers 122-1 to 122-M, and clock selector switches 123-1 to 123-M are further included, and lower-bit Gray code generation circuits 124-1 to 124-M are included instead of the lower-bit Gray code generation circuit 18.

It is to be noted that, in the following description, in a case where distinctions between the clock buffers 122-1 to 122-M, between the clock selector switches 123-1 to 123-M, and between the lower-bit Gray code generation circuits 124-1 to 124-M are not necessary, the clock buffers 122-1 to 122-M, the clock selector switches 123-1 to 123-M, and the lower-bit Gray code generation circuits 124-1 to 124-M may be simply referred to as "clock buffer 122", "clock selector switch 123", and "lower-bit Gray code generation circuit 124", respectively. Moreover, the lower-bit Gray code generation circuits 124 have a function similar to that of the lower-bit Gray code generation circuit 18 in FIG. 1, and will not be further described.

In the image sensor 110 in FIG. 6, the number (column number) of pixel columns of the pixels 11 is adequately larger than the number of pixel columns of the pixels 11 in the CMOS image sensor 10 in FIG. 1. Moreover, in the image sensor 110 in FIG. 6, the clock buffer 122, the clock selector switch 123, and the lower-bit Gray code generation circuit 124 are provided to every plurality of column AD conversion circuits 14.

In other words, for example, in a case where the clock buffer 122, the clock selector switch 123, and the lower-bit Gray code generation circuit 124 are provided to every 256 columns, the column number in the image sensor 110 is 256*M columns.

The clock selector switch 121 is a switch for selecting a clock signal from the clock generation circuit 16 or a reference pulse signal from a reference pulse generation circuit (not illustrated) to supply the selected signal to the clock buffer 122.

The clock buffer 122 is provided to every plurality of columns, for example, every 256 columns to distribute the clock signal or the reference pulse signal from the clock selector switch 121 to the column AD conversion circuits 14 for respective columns with low skew.

The clock selector switch 123 is a switch for selecting whether the clock signal distributed by the clock buffer 122 is to be transmitted to the lower-bit Gray code generation circuit 124 or the reference pulse signal is to be transmitted to the storing operation control circuit 36.

With the above-described configuration, the clock buffer 122 and the low-bit Gray code generation circuit 124 are provided to every plurality of columns such as every 256 columns, and the clock signal from the clock generation circuit 16 is distributed to the lower-bit Gray code generation circuit 124; therefore, effects similar to those in the image sensor 10 in FIG. 1 are obtained, and even in an image sensor with a large number of columns, a load of pulse transmission from the low-bit Gray code generation circuit to the column AD conversion circuits for respective columns is allowed to be reduced, and high-speed pulses without delay are allowed to be transmitted.

It is to be noted that, since the clock signal is distributed from the clock generation circuit 16 to the lower-bit Gray code generation circuits 124 with different delays, the lower-bit Gray code generation circuits 124 operate at different timings. Thus, count values in Gray code counted by the lower-bit Gray code generation circuits 124 are different from one another, but the delay of the clock signal is fixed for each of the lower-bit Gray code generation circuits 124; therefore, an influence by the delay is cancelled by CDS processing, and a correct count value is obtainable in the end.

[About Reference Pulse Transmission]

Incidentally, also in the image sensor 110 illustrated in FIG. 6, the lower-bit storing operation is performed between the reset level reading operation and the signal level reading operation and after the signal level reading operation. Assuming that a period in which the lower bit storing operation is performed is referred to as "lower-bit storing period", in the lower-bit storing period, the lower-bit Gray code generation circuit 124 does not need to perform counting. In other words, in the lower-bit storing period, it is not necessary to distribute the clock signal from the clock generation circuit 16 to the lower-bit Gray code generation circuit 124 through the clock buffer 122.

Thus, in the lower-bit storing period, the clock selector switches 121 and 122 are turned to the reference pulse signal side.

In other words, in periods of the reset level reading operation and the signal level reading operation, the clock selector switches 121 and 122 are turned to the clock signal side so as to distribute the clock signal from the clock generation circuit 16 to the lower-bit Gray code generation circuit 124 through the clock buffer 122. After that, when the output of the comparator 31 is reversed, a count value in Gray code of the lower-bit Gray code generation circuit 124 at this time is held by the lower-bit storage element 32. The count value in Gray code held by the lower-bit storage element 32 is converted into binary data by the Gray code binary conversion circuit 35 to be supplied to the storing operation control circuit 36.

Then, in the lower-bit storing period, the clock selector switches 121 and 122 are turned to the reference pulse signal side so as to distribute the reference pulse signal to the storing operation control circuit 36 through the clock buffer 122. Therefore, the storing operation control circuit 36 is allowed to store the count value in the lower-bit U/D CNT 37, based on the reference pulse signal and binary data from the Gray code binary conversion circuit 35.

Since the clock selector switches 121 and 122 are turned from the clock signal side to the reference pulse signal side in the lower-bit storing period in such a manner, it is not necessary to further include a clock buffer for the reference pulse signal, and a load of transmission of the reference pulse signal is allowed to be suppressed, and a high-speed reference pulse signal without delay is allowed to be transmitted. Therefore, the lower-bit storing period is allowed to be shortened, and a time necessary for CDS processing is allowed to be shortened accordingly.

Incidentally, in the configuration of the above-described column AD conversion circuit 14, when a carry occurs in a count value to be input to the lower-bit storage element 32, a most significant bit signal is supplied to the higher-bit U/D CNT 34. However, in a case where the output of the comparator 31 is reversed at the moment of the carry, the count value of the lower-bit storage element 32 is not carried because of a ripple of the most significant bit signal; however, a bit mismatch caused by counting the count value in the higher-bit U/D CNT 34 in spite of not carrying the count value of the lower-bit storage element 23, that is, so-called metastable may occur. Accordingly, miscounting may occur.

Therefore, a configuration taking measures against metastable will be described below.

<3. Application Example Taking Measures Against Metastable>

[Configuration Example of Solid-State Image Pickup Device]

Figure 7:
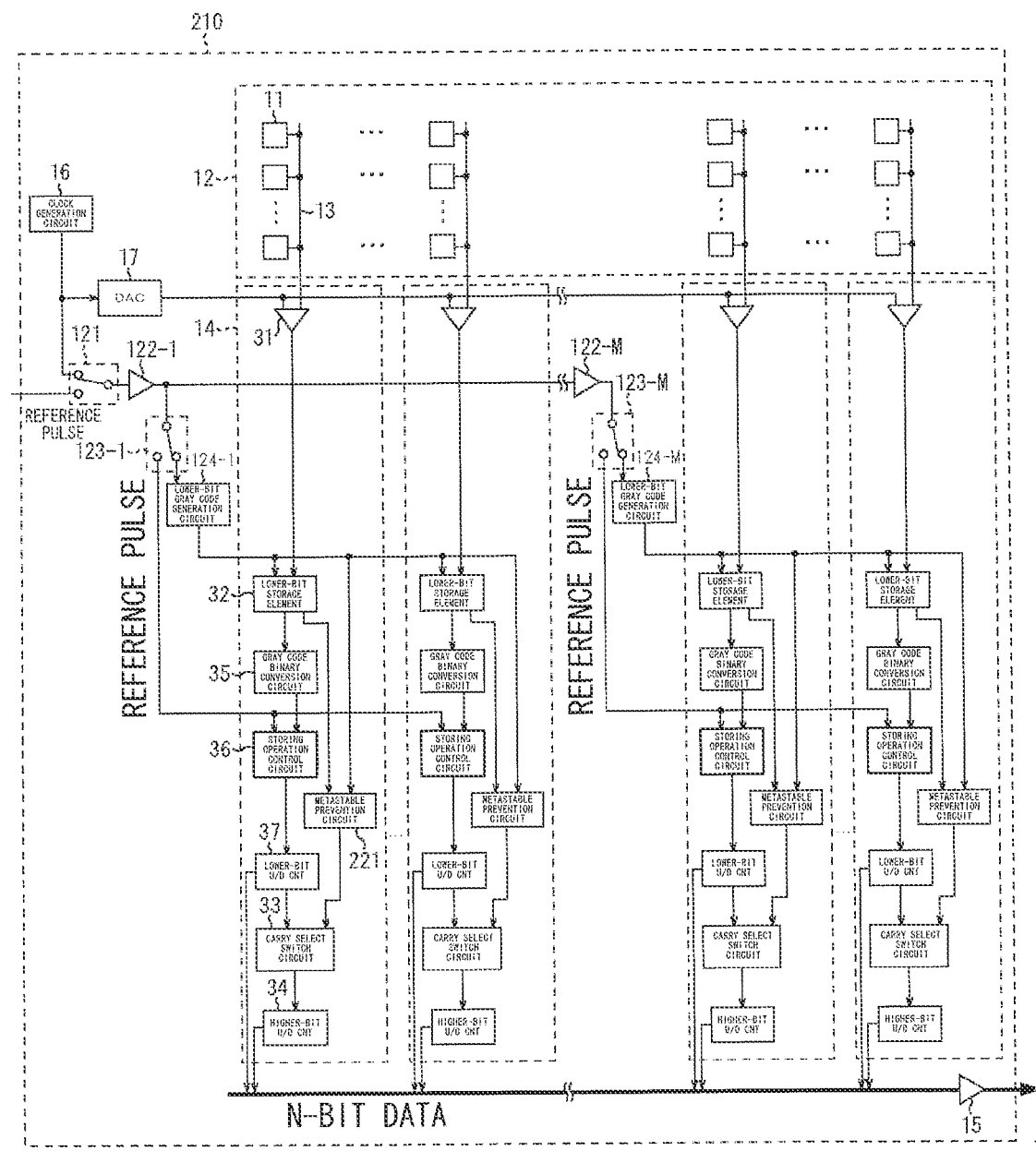
FIG. 7 is a block diagram illustrating still another functional configuration example of the solid-state image pickup device.

FIG. 7 illustrates a configuration example of an image sensor (a CMOS image sensor) as a solid-state image pickup device taking measures against metastable.

It is to be noted that, in an image sensor 210 in FIG. 7, like components are denoted by like numerals as of the image sensor 110 in FIG. 6 and will not be further described.

In other words, the image sensor 210 in FIG. 7 is different from the image sensor 110 in FIG. 6 in that a metastable prevention circuit 221 is further included in the column AD conversion circuit 14.

The metastable prevention circuit 221 operates with use of a count in Gray code of the lower-bit Gray code generation circuit 18 as a clock, and delays the most significant bit signal from the lower-bit storage element 32, and supplies the delayed most significant bit signal to the higher-bit U/D CNT 34.

More specifically, the metastable prevention circuit 221 generates a mask signal for temporarily masking the falling edge of the most significant bit signal from the lower-bit storage element 32, based on the count (the clock) of the lower-bit Gray code generation circuit 18. The metastable prevention circuit 221 masks the falling edge of the most significant bit signal from the lower-bit storage element 32 with the mask signal. Then, when masking by the mask signal is cleared, the metastable prevention circuit 221 supplies the unmasked most significant bit signal to the higher-bit U/D CNT 34.

In the above-described configuration, the most significant bit signal from the lower-bit storage element 32 is delayed and then is supplied to the higher-bit U/D CNT 34; therefore, effects similar to those in the image sensor 110 in FIG. 6 are obtained, and metastable caused by counting the count value in the higher-bit U/D CNT 34 in spite of not carrying the count value of the lower-bit storage element 23 is preventable.

It is to be noted that the above-described metastable prevention circuit 221 may be provided to the column AD conversion circuit 14 in FIG. 1.

Moreover, in the above-described image sensor, a Gray code counted by the lower-bit Gray code generation circuit 18 (the lower-bit Gray code generation circuit 124) as a Gray code counter is used as a clock signal, and a count value is held by a storage element. On the other hand, in the above-described image sensor, instead of the lower-bit Gray code generation circuit 18 (the lower-bit Gray code generation circuit 124), a count code generation circuit performing counting in a count pattern by a predetermined rule such as a phase shift code may be included, and a count code may be used as a clock signal, and a count value may be held by the storage element.

Even in such a configuration, effects similar to those in the above-described image sensor are obtained.

Moreover, in the above description, the reference pulse signal is configured through arranging n-number of pulse trains in order from a pulse train corresponding to a least significant bit, where the bit number of lower bits is n; however, the n-number of pulse trains may be arranged in different order.

Figure 8:
FIG. 8 is a diagram describing another example of the reference pulses.

For example, the reference pulse signal may be configured through arranging n-number of pulse trains in order from a pulse train corresponding to a higher bit, that is, an nth bit, where the bit number of lower bits is n. More specifically, as illustrated in FIG. 8, the reference pulse signal may be a pulse signal configured of n-number of pulse trains of $2^n$, . . . , 8, 4, 2, and 1 pulses. It is to be noted that, in this case, the operations of the BIN selection switches SW_0 to SW_n may be performed in order corresponding to the order of the pulse trains.

Moreover, in the image sensor to which the present technology is applied, it is only necessary for the storing operation control circuit 36 to be able to supply (store) the pulse signal corresponding to binary data from the Gray code binary conversion circuit 35 to (in) the lower-bit U/D CNT 37, and the configuration of the storing operation control circuit 36 is not limited to that illustrated in FIG. 2, and may be any other configuration.

<4. Others>

Moreover, the present technology is applicable to a solid-state image pickup device with a laminate configuration.

[Configuration Example of Solid-State Image Pickup Device with Laminate Configuration]

Figure 9:
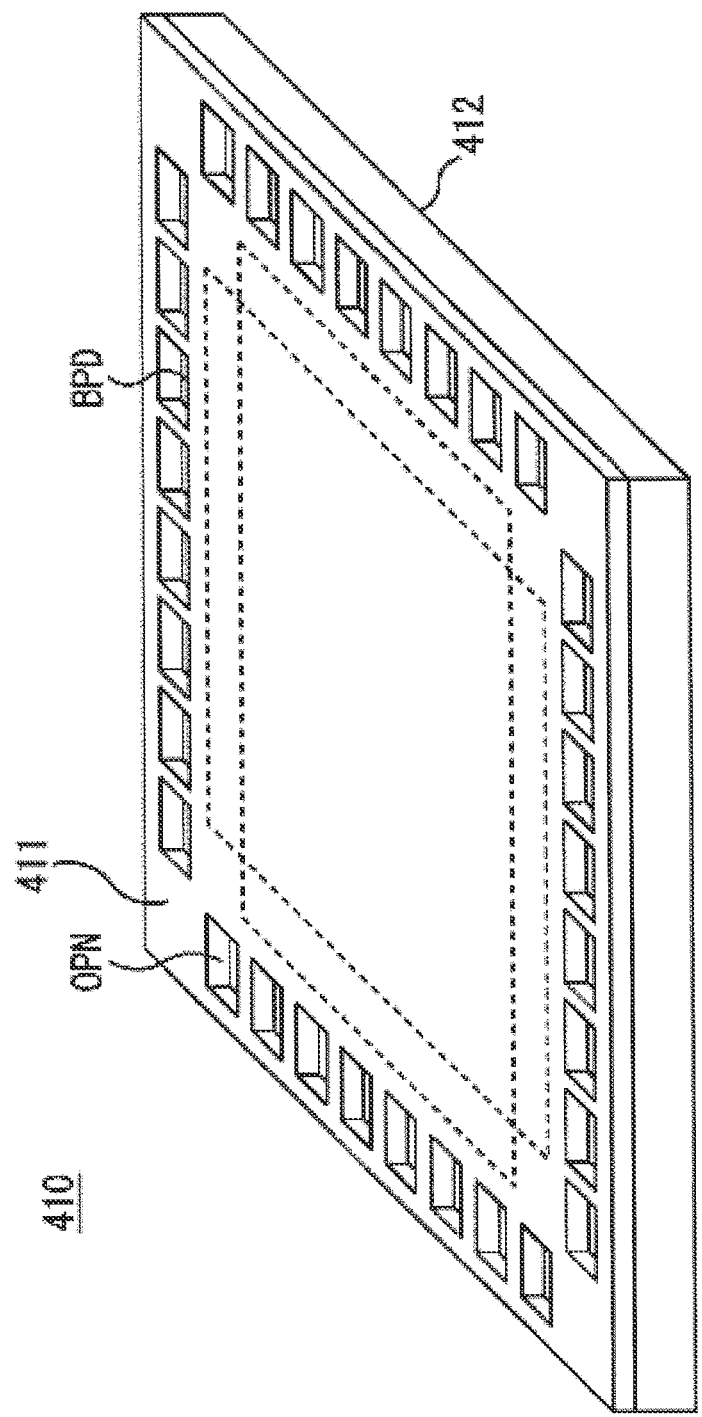
FIG. 9 is a diagram illustrating a configuration example of a solid-state image pickup device with a laminate configuration.

FIG. 9 illustrates a configuration example of a solid-state image pickup device with a laminate configuration to which the present technology is applied.

As illustrated in FIG. 9, a solid-state image pickup device 410 has a laminate configuration of a first chip (an upper chip) 411 and a second chip (a lower chip) 412. The solid-state image pickup device 410 is formed as a solid-state image pickup device with a laminate configuration through bonding at a wafer level and then cutting by dicing.

In the laminate configuration of the two chips, that is, the upper and lower chips, the first chip 411 is configured of a CMOS image sensor (CIS) chip, and the second chip 412 is configured of a logic chip including a control circuit for the first chip 411 and an image processing circuit. A bonding pad BPD and an input-output circuit are formed in the second chip (the lower chip) 412, and opening sections OPN for wire bonding to the second chip 412 is formed in the first chip (the upper chip).

The solid-state image pickup device 410 with a laminate configuration of such two chips has the following characteristic configuration.

(1) An edge section where image signals are transmitted between the upper and lower chips 411 and 412 are an output section of a comparator or a sigma-delta modulator as a boundary circuit with a digital-system circuit of an analog-system circuit.

(2) Connection between the upper and lower chips 411 and 412 is made through, for example, vias.

(3) The first chip (the upper chip) 411 uses a CIS (CMOS Image Sensor) process. However, only a high-voltage transistor (CMOS) is used for a transistor, and the minimum necessary number of wiring layers for configurations of a pixel array and its peripheral circuits are used to reduce cost. Herein, a high-voltage transistor refers to a transistor having a larger thickness of a gate oxide film as a gate insulating film than that of a typical MOS transistor and being operable without any trouble under high voltages. It is to be noted that, for a typical CIS process, a low-voltage LV, high-speed transistor is also necessary in addition to the high-voltage transistor for high-speed logic circuits such as a control circuit and an image processing circuit. Further, for the high-speed logic circuit, a larger number of wiring layers than the minimum necessary number of wiring layers for the pixel array and its peripheral circuits are necessary.

(4) The second chip (lower chip) 412 uses a general logic process to facilitate change and development in FAB.

(5) Circuits necessary for the solid-state pickup device 410 and particularly important in characteristics where demands for analog characteristics and noise characteristics (such as 1/f noise) are strict are mounted on the first chip (the upper chip) 411. In this embodiment, at least a pixel array, a vertical decoder, a driver, and the like are mounted on the first chip 411.

(6) Circuits operating at high speed and at a low voltage such as a high-speed logic circuit, a memory, and an interface (I/F) circuit are mounted on the second chip (the lower chip) 412. Process technology and the number of wiring layers are determined in consideration of characteristics and sizes necessary for circuits. Products are developed through combining the same first chip (the upper chip) 411 with the second chips (lower chips) 412 with different functions, characteristics, and processes.

(7) The vias are disposed at chip ends or between a pad (PAD) and a circuit region.

(8) Image signal wiring lines are disposed at an end of a comparator circuit at a wiring pitch of vertical signal lines.

(9) TCVs (through contact vias) for a control signal and power supply are mainly concentrated on four chip corners to reduce a signal wiring region of the first chip (upper chip) 411. To solve issues of an increase in power line resistance and an increase in IR-Drop caused by a reduction in the number of wiring layers in the first chip (upper chip) 411, the TCVs are effectively arranged to enhance a power source of the first chip (upper chip) 411 with use of wiring of the second chip (lower chip) 412 for measures against noise, stable supply, and the like.

[Example of Circuit Layout]

Next, a circuit layout of the solid-state image pickup device 410 with the laminate configuration in FIG. 9, that is, classifications of circuits to be mounted on the first chip (upper chip) 411 and the second chip (lower chip) 412 will be described below referring to FIG. 10.

Figure 10:
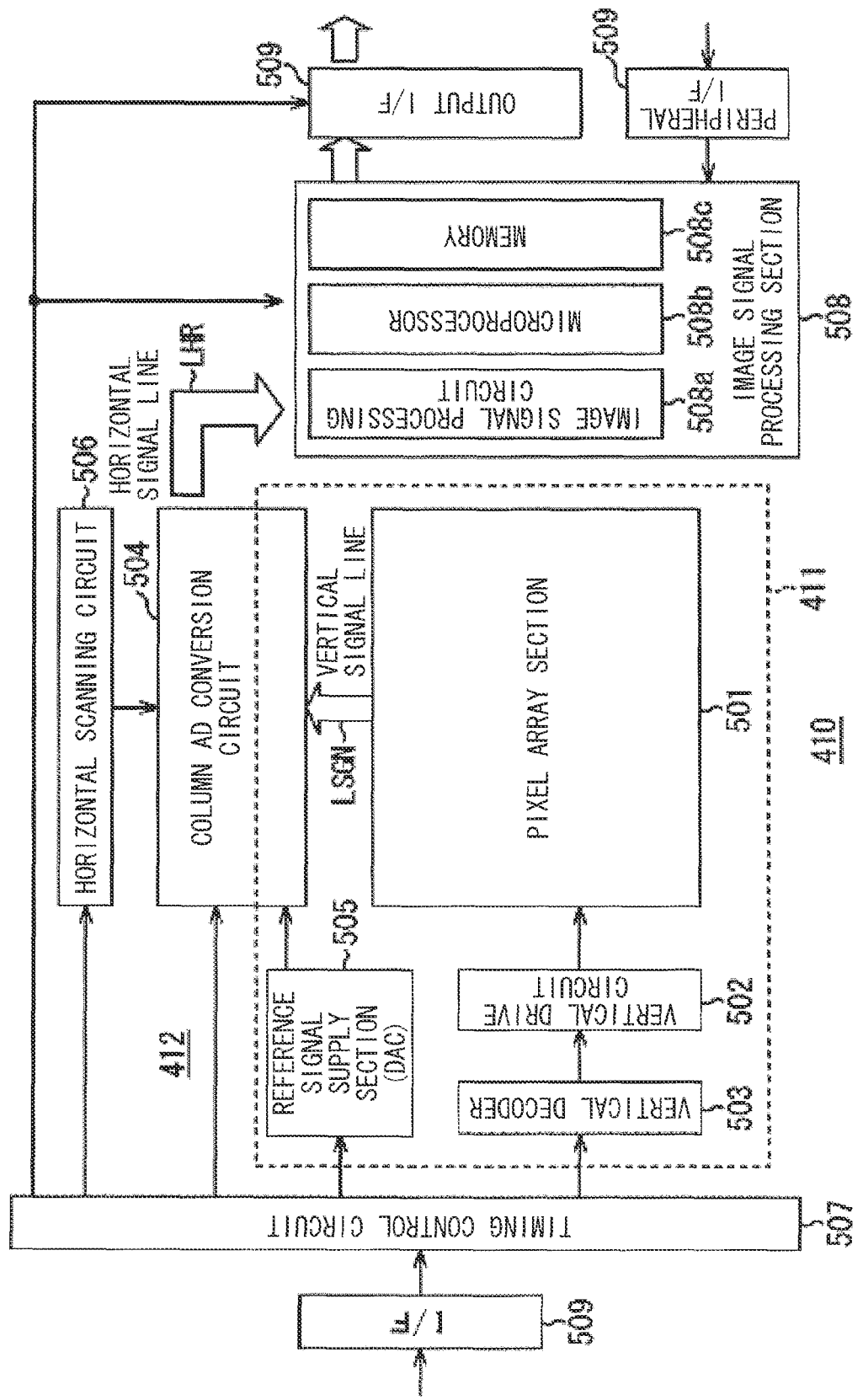
FIG. 10 is a diagram describing a circuit layout of the solid-state image pickup device with the laminate configuration.

The solid-state pickup device 410 in FIG. 10 includes a pixel array section 501 in which a large number of unit pixels (not illustrated) each including a photoelectric conversion element are two-dimensionally arranged in a matrix.

Moreover, the solid-state image pickup device 410 includes a vertical drive circuit (row scanning circuit) 502, a vertical decoder 503, a column AD conversion circuit 504, a reference signal supply section 505, a horizontal scanning circuit (column scanning circuit) 506, a timing control circuit 507, and an image signal processing section 508.

The solid-state image pickup device 410 further includes I/F-based circuits 509.

In the solid-state image pickup device 410 in FIG. 10, the timing control circuit 507 generates clock signals, control signals, and the like as references for operation of the vertical drive circuit 502, the column AD conversion circuit 504, the reference signal supply section 505, and the horizontal scanning circuit 506, based on a master clock.

Moreover, peripheral drive systems which drive and control the unit pixels of the pixel array section 501, and analog systems, i.e., the vertical drive circuit 502, a part of the column AD conversion circuit 504, the reference signal supply section 505, and the like are integrated on the same first chip 411 as that where the pixel array section 501 is mounted.

On the other hand, the timing control circuit 507, the image signal processing section 508, the other part of the column AD conversion circuit 504, and the horizontal scanning circuit 506 are integrated on the second chip (semiconductor substrate) 412.

A part surrounded by a broken line in FIG. 10 is arranged on the first chip (the upper chip) 411, and the other part is arranged on the second chip (the lower chip) 412.

Although not illustrated, the unit pixels each include a photoelectric conversion element (for example, a photodiode). Moreover, the unit pixels each include, for example, a transfer transistor transferring an electric charge obtained by photoelectric conversion in the photoelectric conversion element to an FD (floating diffusion) section, in addition to the photoelectric conversion element. A three-transistor configuration including, in addition to the transfer transistor, a rest transistor which controls a potential of the FD section and an amplification transistor which outputs a signal corresponding to the potential of the FD section may be applicable as the unit pixels. Alternatively, a four-transistor configuration further including a selection transistor for selecting pixels, or the like may be applicable as the unit pixels.

The unit pixels are two-dimensionally arranged in the pixel array section 501 in m rows and n columns, a row control line is provided to each row of the pixel arrangement of m rows and n columns and a column signal line is provided to each column of the pixel arrangement of m rows and n columns. One end of each row control line is connected to an output end corresponding to each row of the vertical drive circuit 502. The vertical drive circuit 502 is configured of a shift register or the like, and controls row addresses and row scanning of the pixel array section 501 through the row control lines.

The column AD conversion circuit 504 corresponds to the column AD conversion circuit 14 in FIG. 1, and includes ADCs (analog digital converters) each provided to each pixel column of the pixel array section 501, that is, each vertical signal line LSGN to convert analog signals output from the unit pixels of each column of the pixel array section 501 into N-bit digital signals, and then to output the digital signals.

The reference signal supply section 505 includes, for example, a DAC (digital-to-analog converter) as a means for generating a reference voltage Vref having a so-called ramp waveform whose level varies obliquely with time. It is to be noted that the means for generating the reference voltage Vref having the ramp waveform is not limited to the DAC.

The DAC generates the reference voltage Vref having the ramp waveform, based on a clock provided from the timing control circuit 507, and supplies the reference voltage Vref to the ADCs of the column AD conversion circuit 504 under control by a control signal provided from the timing control circuit 507.

The horizontal scanning circuit 506 is configured of a shift resistor or the like, and controls column addresses of the ADCs and column scanning in the column AD conversion circuit 504. Under control by the horizontal scanning circuit 506, the N-bit digital signals obtained by AD conversion by the respective ADCs are sequentially read into a horizontal signal line LHR, and the N-bit digital signals are output as image pickup data to the image signal processing section 508 through the horizontal signal line LHR.

The image signal processing section 508 is a circuit performing various kinds of signal processing on the image pickup data, and is configured through including an image signal processor (ISP) 508*a*, a microprocessor 508*b*, a memory circuit 508*a*, and the like.

In the above-described solid-state image pickup device with the laminate configuration, flexibility in limitation of a circuit size is allowed to be increased.

In particular, in the column AD conversion circuit 14 in FIG. 1 corresponding to the column AD conversion circuit 504, in terms of a circuit size of each column, the circuit size is increased; however, when the present technology is applied to the solid-state image pickup device with the laminate configuration, an influence on a sensor size caused by an increase in the circuit size of each column is allowed to be limited.

[Configuration Example of Electronic Apparatus to which the Present Technology is Applied]

It is to be noted that the present technology is not limited to application to solid-state image pickup devices. In other words, the present technology is applicable to electronic apparatuses of any kind using a solid-state image pickup element in an image capturing section (a photoelectric conversion section) such as image pickup apparatuses including digital still cameras and video cameras, portable terminals having an image pickup function, and copying machines using a solid-state image pickup element in an image scanning section. The solid-state image pickup device may be formed in a form of one chip, or in a form of a module having an image pickup function in which an image pickup section and a signal processing section or an optical system are collectively packaged.

Figure 11:
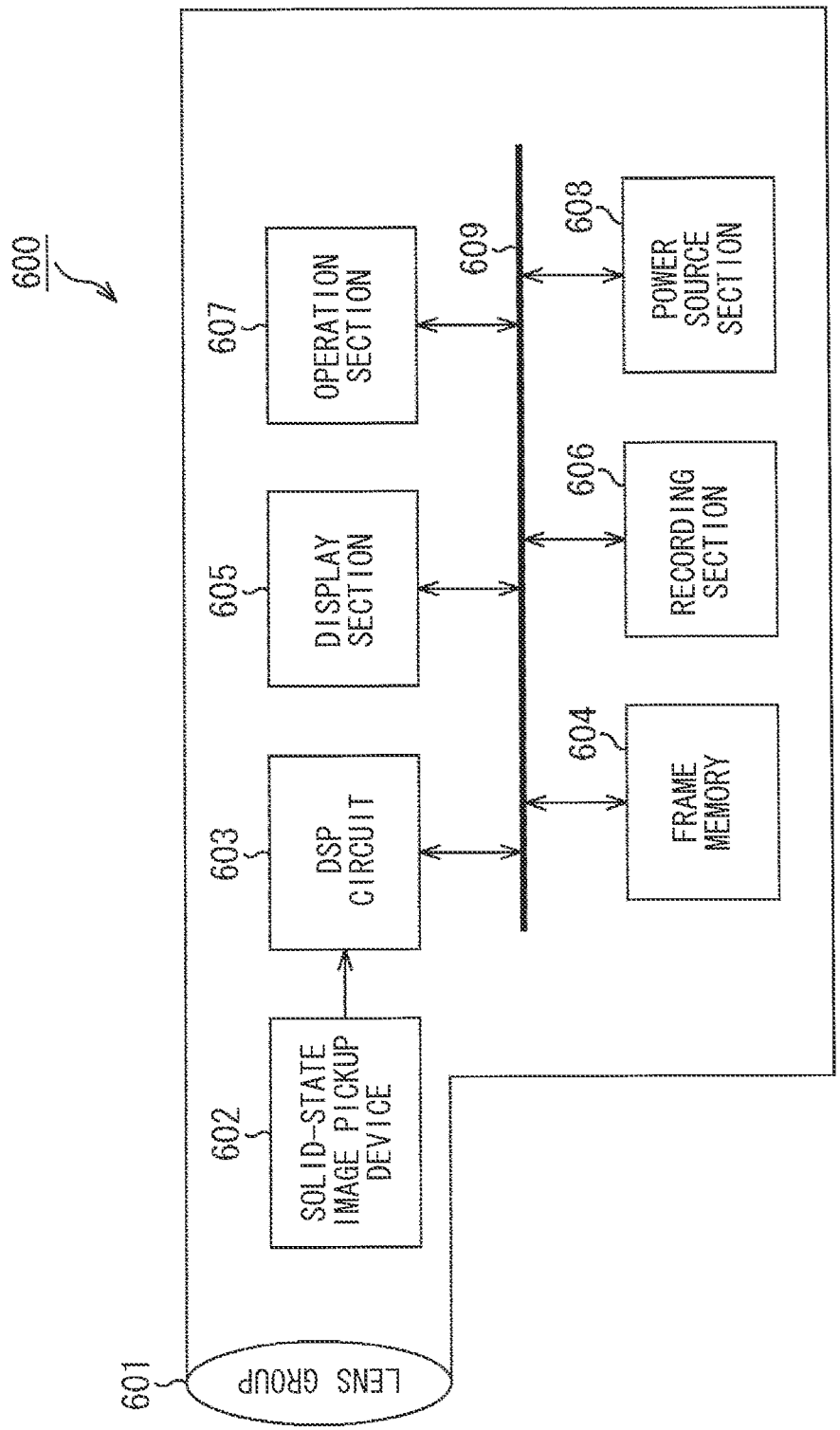
FIG. 11 is a diagram illustrating a configuration example of an embodiment of an electronic apparatus to which the present technology is applied.

FIG. 11 is a block diagram illustrating a configuration example of an image pickup apparatus as an electronic apparatus to which the present technology is applied.

An image pickup apparatus 600 in FIG. 11 includes an optical section 601 configured of a lens group and the like, a solid-state image pickup device (image pickup device) 602 adopting any of the above-described configuration of unit pixels 50, and a DSP circuit 603 as a camera signal processing circuit. The image pickup apparatus 600 further includes a frame memory 604, a display section 605, a recording section 606, an operation section 607, and a power source section 608. The DSP circuit 603, the frame memory 604, the display section 605, the recording section 606, the operation section 607, and the power source section 608 are connected to one another through a bus line 609.

The optical section 601 forms an image on an image pickup plane of the solid-state image pickup device 602 through taking incident light (image light) from an object. The solid-state image pickup device 602 converts a light amount of the incident light forming an image on the image pickup plane by the optical section 601 into an electrical signal for each pixel, and outputs the electrical signal as a pixel signal. As the solid-state image pickup device 602, a solid-state image pickup device such as the image sensor 10 according to the above-described embodiment, that is, a solid-state image pickup device storing a count value in a storage element with use of a count code in a count pattern by a predetermined rule as a clock signal may be used.

The display section 605 is configured of, for example, a panel-type display unit such as a liquid crystal panel or an organic EL (Electro Luminescence) panel, and displays moving or still images picked up by the solid-state image pickup device 602. The recording section 606 records the moving or still images picked up by the solid-state image pickup device 602 to a recording medium such as a video tape or a DVD (Digital Versatile Disk).

The operation section 607 issues operation commands to enable various functions provided to the image pickup apparatus 600 under an operation by a user. The power source section 608 appropriately supplies various kinds of power sources as operation power sources of the DSP circuit 603, the frame memory 604, the display section 605, the recording section 606, and the operation section 607 to these targets.

As described above, for example, when the image sensor 10 according to the above-described embodiment is used as the solid-state image pickup device 602, it is not necessary to include a storage element holding a count value of a reset component and a storage element holding a count value of a signal component, and it is not necessary to include signal lines transmitting the count values of the reset components and the signal components to a subtracter determining a difference between the reset component and the signal component; therefore, power consumption is allowed to be reduced while reducing a circuit size. Therefore, downsizing and power saving in the image pickup apparatus 600 such as a video camera, a digital camera, or a camera module for a mobile device such as a cellular phone are achievable.

Moreover, in the above-described embodiments, a case where the present technology is applied to a CMOS image sensor configured through arranging, in a matrix, unit cells detecting a signal charge as physical quantity corresponding to a light amount of visible light is described as an example. However, the present technology is not limited to application to the CMOS image sensor, and is applicable to any kind of column-type solid-state image pickup element configured through providing column processing sections to respective pixel columns of the pixel array section.

Further, the present technology is not limited to application to the solid-state image pickup element which detects a distribution of an incident light amount of visible light and picks up the distribution as an image, and is applicable to a solid-state image pickup element which picks up a distribution of an incident amount of infrared radiation, X-ray radiation, particles, or the like as an image, and any kind of solid-state image pickup device (physical quantity distribution detection device) in a broad sense, such as a fingerprint detection sensor which detects a distribution of any other physical quantity such as pressure or capacitance and picks up the distribution as an image.

It is to be noted that embodiments of the present technology are not limited to the above-described embodiments, and may be variously modified without departing from the scope of the present technology.

Moreover, the present technology may have the following configurations.

(1) An A/D converter including:

a comparison section comparing a reference voltage with an input voltage, the reference voltage having a ramp waveform whose voltage value varies with time;

a storage section holding a count value in a predetermined count pattern, based on an output signal from the comparison section;

a conversion section converting the count value in the count pattern held by the storage section into binary data; and a supply section supplying a pulse signal corresponding to the binary data obtained by conversion in the conversion section to a first counter.

(2) The A/D converter according to (1), in which the storage section supplies, to a second counter, a most significant bit signal representing a most significant bit of the count value in the count pattern until the output signal from the comparison section is reversed, and holds lower bits lower than the most significant bit of the count value in the count pattern when the output signal from the comparison section is reversed.

(3) The A/D converter according to (2), in which the conversion section converts lower bits of the count value in the count pattern into the binary data, and the supply section supplies, to the first counter, a pulse signal corresponding to a value of each bit in the binary data of a reference signal serving as a reference pulse signal.

(4) The A/D converter according to (3), in which the reference signal is a pulse signal configured of n-number of pulse trains of $2^0$ to $2^n$ pulses, where the bit number of the lower bits is n, and the supply section supplies, to the first counter, a pulse train corresponding to each bit whose value is 1 of 0th to nth bits in the binary data of the reference signal.

(5) The A/D converter according to (3) or (4), in which the second counter counts a most significant bit of a count value in the first counter as a carry.

(6) The A/D converter according to any one of (2) to (5), further including a bit mismatch prevention section preventing a bit mismatch of the most significant bit signal supplied to the second counter.

(7) The A/D converter according to any one of (1) to (6), in which the count pattern is a Gray code.

(8) The A/D converter according to any one of (1) to (6), in which the count pattern is a phase shift code.

(9) A solid-state image pickup device including:

a pixel array in which a plurality of pixels performing photoelectric conversion are arranged in a matrix; and an A/D converter provided to every column or every plurality of columns of the pixels and converting analog signals output from the pixels of each column into digital signals, in which the A/D converter includes a comparison section comparing a reference voltage with an input voltage of the analog signal, the reference voltage having a ramp waveform whose voltage value varies with time, a storage section holding a count value in a predetermined count pattern, based on an output signal from the comparison section, a conversion section converting the count value in the count pattern held by the storage section into binary data, and a supply section supplying a pulse signal corresponding to the binary data obtained by conversion in the conversion section to a first counter.

(10) The solid-state image pickup device according to (9), in which the storage section supplies, to a second counter, a most significant bit signal representing a most significant bit of the count value in the count pattern until the output signal from the comparison section is reversed, and holds lower bits lower than the most significant bit of the count value in the count pattern when the output signal from the comparison section is reversed.

(11) The solid-state image pickup device according to (10), in which the conversion section converts lower bits of the count value in the count pattern into the binary data, and the supply section supplies, to the first counter, a pulse signal corresponding to a value of each bit in the binary data of a reference signal serving as a reference pulse signal.

(12) The solid-state image pickup device according to (11), in which the reference signal is a pulse signal configured of n-number of pulse trains of $2^0$ to $2^n$ pulses, where the bit number of the lower bits is n, and the supply section supplies, to the first counter, a pulse train corresponding to each bit whose value is 1 of 0th to nth bits in the binary data of the reference signal.

(13) The solid-state image pickup device according to (11) or (12), in which the second counter counts a most significant bit of a count value in the first counter as a carry.

(14) The solid-state image pickup device according to any one of (9) to (13), further including:

a clock generation section generating a clock signal; and an input section inputting a count value in the count pattern to the storage section, based on the clock signal.

(15) The solid-state image pickup device according to (14), in which the input section is provided to every plurality of the A/D converters, a clock buffer for transmitting the clock signal to the input section provided to every plurality of the A/D converters is provided to every plurality of the A/D converters, and the clock buffer transmits the reference signal to the supply section after the output signal of the comparison section is reversed.

(16) The solid-state image pickup device according to any one of (10) to (15), further including a bit mismatch prevention section preventing a bit mismatch of the most significant bit signal supplied to the second counter.

(17) The solid-state image pickup device according to any one of (9) to (16), in which the count pattern is a Gray code.

(18) The solid-state image pickup device according to any one of (9) to (16), in which the count pattern is a phase shift code.

(19) A method of driving a solid-state imaging device, the solid-state imaging device including a pixel array in which a plurality of pixels performing photoelectric conversion are arranged in a matrix, and an A/D converter provided to every column or every plurality of columns of the pixels and converting analog signals output from the pixels of each column into digital signals, the method including:

a comparing step of allowing the A/D converter to compare a reference voltage with an input voltage of the analog signal, the reference voltage having a ramp waveform whose voltage value varies with time;

a storing step of allowing the A/D converter to hold a count value in a predetermined count pattern, based on an output signal from the comparison section;

a converting step of allowing the A/D converter to convert the count value in the count pattern held by the storage section into binary data; and a supplying step of allowing the A/D converter to supply a pulse signal corresponding to the binary data obtained by conversion in the conversion section to a counter.

(20) An electronic apparatus provided with a solid-state image pickup device, the solid-state image pickup device including:

a pixel array in which a plurality of pixels performing photoelectric conversion are arranged in a matrix; and an A/D converter provided to every column or every plurality of columns of the pixels and converting analog signals output from the pixels of each column into digital signals, in which the A/D converter includes a comparison section comparing a reference voltage with an input voltage of the analog signal, the reference voltage having a ramp waveform whose voltage value varies with time;

a storage section holding a count value in a predetermined count pattern, based on an output signal from the comparison section;

a conversion section converting the count value in the count pattern held by the storage section into binary data; and a supply section supplying a pulse signal corresponding to the binary data obtained by conversion in the conversion section to a counter.

REFERENCE SIGNS LIST

10 image sensor, 14 column AD conversion circuit, 18 lower-bit Gray code generation circuit, 19 reference pulse generation circuit, 31 comparator, 32 lower-bit storage element, 34 higher-bit U/D CNT, 35 Gray code binary conversion circuit, 36 storing operation control circuit, 37 lower-bit U/D CNT

The invention claimed is:

1. An A/D converter comprising:
a comparison section that compares a reference voltage with an input voltage, the reference voltage having a ramp waveform whose voltage value varies with time;
a storage section that holds a count value in a predetermined count pattern, based on an output signal from the comparison section;
a conversion section that converts the count value held by the storage section into binary data; and
a supply section that supplies a pulse signal corresponding to the binary data obtained by conversion in the conversion section to a first counter,
wherein the storage section supplies, to a second counter, a most significant bit signal representing a most significant bit of the count value in the count pattern until the output signal from the comparison section is reversed, and holds lower bits that are lower than the most significant bit of the count value in the count pattern when the output signal from the comparison section is reversed.

2. The A/D converter according to claim 1, wherein
the conversion section converts lower bits of the count value in the count pattern into the binary data, and the supply section supplies, to the first counter, a pulse signal corresponding to a value of each bit in the binary data of a reference signal serving as a reference pulse signal.

3. The A/D converter according to claim 2, wherein
the reference signal is a pulse signal configured of n-number of pulse trains of $2^0$ to $2^n$ pulses, where the bit number of the lower bits is n, and
the supply section supplies, to the first counter, a pulse train corresponding to each bit whose value is 1 of 0th to nth bits in the binary data of the reference signal.

4. The A/D converter according to claim 2, wherein the second counter counts a most significant bit of a count value in the first counter as a carry.

5. The A/D converter according to claim 1, further comprising a bit mismatch prevention section preventing a bit mismatch of the most significant bit signal supplied to the second counter.

6. The A/D converter according to claim 1, wherein the count pattern is a Gray code.

7. The A/D converter according to claim 1, wherein the count pattern is a phase shift code.

8. A solid-state image pickup device comprising:
a pixel array in which a plurality of pixels performing photoelectric conversion are arranged in a matrix; and
an A/D converter provided to every column or every plurality of columns of the pixels and converting analog signals output from the pixels of each column into digital signals,
wherein the A/D converter includes
a comparison section that compares a reference voltage with an input voltage of the analog signal, the reference voltage having a ramp waveform whose voltage value varies with time,
a storage section that holds a count value in a predetermined count pattern, based on an output signal from the comparison section,
a conversion section that converts the count value held by the storage section into binary data, and
a supply section that supplies a pulse signal corresponding to the binary data obtained by conversion in the conversion section to a first counter,
wherein the storage section supplies, to a second counter, a most significant bit signal representing a most significant bit of the count value in the count pattern until the output signal from the comparison section is reversed, and holds lower bits that are lower than the most significant bit of the count value in the count pattern when the output signal from the comparison section is reversed.

9. The solid-state image pickup device according to claim 8, wherein
the conversion section converts lower bits of the count value in the count pattern into the binary data, and
the supply section supplies, to the first counter, a pulse signal corresponding to a value of each bit in the binary data of a reference signal serving as a reference pulse signal.

10. The solid-state image pickup device according to claim 9, wherein
the reference signal is a pulse signal configured of n-number of pulse trains of $2^0$ to $2^n$ pulses, where the bit number of the lower bits is n, and
the supply section supplies, to the first counter, a pulse train corresponding to each bit whose value is 1 of 0th to nth bits in the binary data of the reference signal.

11. The solid-state image pickup device according to claim 9, wherein the second counter counts a most significant bit of a count value in the first counter as a carry.

12. The solid-state image pickup device according to claim 8, further comprising:
a clock generation section generating a clock signal; and
an input section inputting a count value in the count pattern to the storage section, based on the clock signal.

13. The solid-state image pickup device according to claim 12, wherein
the input section is provided to every plurality of the A/D converters,
a clock buffer for transmitting the clock signal to the input section provided to every plurality of the A/D converters is provided to every plurality of the A/D converters, and
the clock buffer transmits the reference signal to the supply section after the output signal from the comparison section is reversed.

14. The solid-state image pickup device according to claim 8, further comprising a bit mismatch prevention section preventing a bit mismatch of the most significant bit signal supplied to the second counter.

15. The solid-state image pickup device according to claim 8, wherein the count pattern is a Gray code.

16. The solid-state image pickup device according to claim 8, wherein the count pattern is a phase shift code.

17. A method of driving a solid-state imaging device, the solid-state imaging device including a pixel array in which a plurality of pixels performing photoelectric conversion are arranged in a matrix, and an A/D converter provided to every column or every plurality of columns of the pixels and converting analog signals output from the pixels of each column into digital signals, the method comprising:
comparing, by a comparison section of the A/D converter, a reference voltage with an input voltage of the analog signal, the reference voltage having a ramp waveform whose voltage value varies with time;
holding, by a storage section of the A/D converter, a count value in a predetermined count pattern, based on an output signal from the comparison section;
converting, by a conversion section of the A/D converter, the count value in the count pattern held by the storage section into binary data;
supplying, by the A/D converter, a pulse signal corresponding to the binary data obtained by conversion in the conversion section to a counter; and
supplying a most significant bit signal representing a most significant bit of the count value in the count pattern until the output signal from the comparison section is reversed, and holding lower bits that are lower than the most significant bit of the count value in the count pattern when the output signal from the comparison section is reversed.

18. An electronic apparatus comprising the solid-state image pickup device according to claim 8.

19. An A/D converter comprising:
comparison circuitry that compares a reference voltage with an input voltage, the reference voltage having a ramp waveform whose voltage value varies with time;
a memory that holds a count value in a predetermined count pattern, based on an output signal from the comparison circuitry; and
conversion circuitry that converts the count value held by the memory into binary data,
wherein a pulse signal corresponding to the binary data obtained by conversion in the conversion circuitry is supplied to a first counter, and wherein the memory supplies a most significant bit signal representing a most significant bit of the count value in the count pattern until the output signal from the comparison circuitry is reversed, and holds lower bits that are lower than the most significant bit of the count value in the count pattern when the output signal from the comparison circuitry is reversed.

* * * * *